United States Patent
Lee et al.

(10) Patent No.: US 11,543,707 B2
(45) Date of Patent: *Jan. 3, 2023

(54) DISPLAY PANEL AND DISPLAY DEVICE HAVING THE SAME

(71) Applicant: SAMSUNG DISPLAY CO., LTD., Yongin-si (KR)

(72) Inventors: Kwang Ho Lee, Seoul (KR); Yeo Geon Yoon, Suwon-si (KR); Joong Gun Chong, Yongin-si (KR); Yong Hwan Shin, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/323,177

(22) Filed: May 18, 2021

(65) Prior Publication Data

US 2021/0271123 A1 Sep. 2, 2021

Related U.S. Application Data

(60) Continuation of application No. 16/821,655, filed on Mar. 17, 2020, now Pat. No. 11,036,095, which is a
(Continued)

(30) Foreign Application Priority Data

Jan. 31, 2017 (KR) .......................... 10-2017-0013993

(51) Int. Cl.
*G02F 1/1343* (2006.01)
*G02F 1/1362* (2006.01)
(Continued)

(52) U.S. Cl.
CPC ...... *G02F 1/1343* (2013.01); *G02F 1/136286* (2013.01); *H01L 27/124* (2013.01);
(Continued)

(58) Field of Classification Search
CPC ............. G02F 1/1343; G02F 1/136286; G02F 1/133345; G02F 1/1368; H01L 27/124; H01L 27/1248; G09G 2310/0264
See application file for complete search history.

(56) References Cited

U.S. PATENT DOCUMENTS 6,480,577 B1 11/2002 Izumi et al.
9,690,153 B2 6/2017 Iki
(Continued)

FOREIGN PATENT DOCUMENTS

| EP | 1770788 A2 | 4/2007 |
| KR | 20140148231 A | * 12/2014 |
| KR | 1020140148231 | 12/2014 |

OTHER PUBLICATIONS

Extended European Search Report dated Sep. 10, 2018 for European Patent Application No. 18154285.3.

*Primary Examiner* — Nathanael R Briggs
(74) *Attorney, Agent, or Firm* — F. Chau & Associates, LLC

(57) ABSTRACT

A display panel includes a base substrate. A semiconductor layer is disposed on the base substrate. A source electrode and a drain electrode are disposed on the semiconductor layer. A first insulating layer is disposed on both the source electrode and the drain electrode. A data line is disposed on the first insulating layer. The data line is electrically connected to the source electrode via a contact hole penetrating through the first insulating layer.

16 Claims, 17 Drawing Sheets

Related U.S. Application Data division of application No. 15/853,287, filed on Dec. 22, 2017, now Pat. No. 10,620,485.

(51) Int. Cl.
*H01L 27/12* (2006.01)
*G02F 1/1333* (2006.01)
*G02F 1/1368* (2006.01)

(52) U.S. Cl.
CPC ........ *H01L 27/1248* (2013.01); *G02F 1/1368* (2013.01); *G02F 1/133345* (2013.01); *G09G 2310/0264* (2013.01)

(56) References Cited

U.S. PATENT DOCUMENTS

| | | | |
|---|---|---|---|
| 10,620,485 | B2 | 4/2020 | Lee et al. |
| 11,036,095 | B2 * | 6/2021 | Lee ................. G02F 1/1343 |
| 2009/0251653 | A1 | 10/2009 | Hayashi |
| 2011/0084268 | A1 | 4/2011 | Yamazaki et al. |
| 2012/0043545 | A1 * | 2/2012 | Kim ................. H01L 29/6675 |
| | | | 257/E29.101 |
| 2015/0069396 | A1 | 3/2015 | Kim |
| 2015/0221732 | A1 * | 8/2015 | Kanda ................. H01L 27/1248 |
| | | | 257/72 |
| 2016/0077395 | A1 * | 3/2016 | Iki ................. G02F 1/133345 |
| | | | 257/71 |
| 2018/0217427 | A1 | 8/2018 | Lee et al. |
| 2020/0218103 | A1 | 7/2020 | Lee et al. |

* cited by examiner

DISPLAY PANEL AND DISPLAY DEVICE HAVING THE SAME

This application is a Continuation of co-pending U.S. patent application Ser. No. 16/821,655, filed on Mar. 17, 2020, which is a Division of co-pending U.S. patent application Ser. No. 15/853,287, filed on Dec. 22, 2017, which claims the benefit of Korean Patent Application No. 10-2017-0013993, filed on Jan. 31, 2017, in the Korean Intellectual Property Office, the disclosures of which are herein incorporated by reference in their entirety.

TECHNICAL FIELD

The present disclosure relates to a display panel and a display device having the same.

DISCUSSION OF THE RELATED ART

A display device is a device that includes a display panel. Display panels generally include a plurality of pixels. Display panels may be of various types such as a liquid-crystal display device (LCD device) and an organic light-emitting diode display (OLED display device), etc.

Particularly, a liquid-crystal display panel, which is used in a liquid-crystal display device, is composed of two substrates on which electric field generating electrodes, such as pixel electrodes and common electrodes, are formed. A liquid-crystal layer is injected between the two substrates. Voltage is applied to the electric field generating electrodes to form an electric field across the liquid-crystal layer. As a result of the electric field, the orientation of the liquid crystals contained in the liquid-crystal layer is aligned and the polarization of incident light is controlled, thereby displaying an image.

The pixel electrode is connected to a switching device such as a thin-film transistor (TFT) and receives a data voltage corresponding to a video signal input to the display panel.

SUMMARY

A display panel includes a base substrate. A semiconductor layer is disposed on the base substrate. A source electrode and a drain electrode are disposed on the semiconductor layer. A first insulating layer is disposed on both the source electrode and the drain electrode. A data line is disposed on the first insulating layer. The data line is electrically connected to the source electrode via a contact hole penetrating through the first insulating layer.

A display panel includes a base substrate. A semiconductor layer is disposed on the base substrate. A source electrode and a drain electrode are disposed on the semiconductor layer. A first insulating layer is disposed on both the source electrode and the drain electrode. A connection electrode is disposed on the first insulating layer. A second insulating layer is disposed on the connection electrode. A pixel electrode is disposed on the second insulating layer. The connection electrode is electrically connected to the drain electrode via a first contact hole penetrating through the first insulating layer. The pixel electrode is electrically connected to the connection electrode via a second contact hole penetrating though the second insulating layer.

A display panel includes a first display substrate. A second display substrate is smaller than the first display substrate. A liquid crystal layer is disposed between the first display substrate and the second display substrate. A pixel electrode and a thin-film transistor are disposed on the first display substrate. The thin-film transistor includes a source electrode, a drain electrode, a gate electrode, and a semiconductor layer. A data line is electrically connected to the source electrode. A thickness of the source electrode is less than a thickness of the data line.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
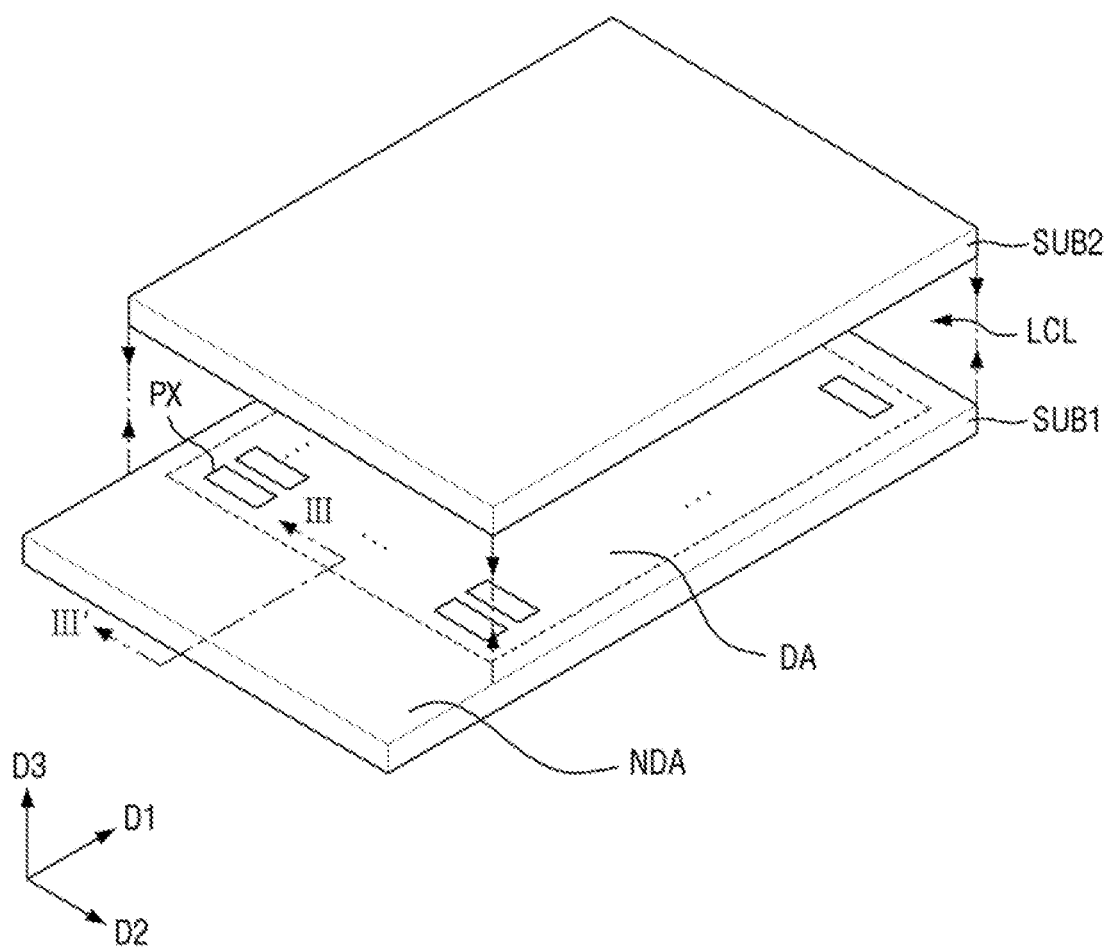
FIG. 1 is a perspective view illustrating a display panel according to an exemplary embodiment of the present disclosure.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

As used herein, an electronic apparatus may be any apparatus that includes a display device. Examples of the electronic apparatus may include smart phones, mobile phones, wearable devices such as smart watches, turn-by-turn navigation systems, video game consoles, TVs, car head units, notebook computers, laptop computers, tablet computers, personal media players (PMPs), and personal digital assistants (PDAs). The electronic apparatus may be embodied as a pocket-sized portable communication terminal having a wireless communication function. Further, the display device may be a flexible display device capable of being bent into an orientation other than flat.

Hereinafter, exemplary embodiments of the present invention will be described with reference to the attached drawings.

FIG. 1 is a perspective view illustrating a display panel according to an exemplary embodiment of the present disclosure.

Referring to FIG. 1, a display panel, according to an exemplary embodiment of the present disclosure, includes a first display substrate SUB1 and a second display substrate SUB2. The second display substrate SUB2 has a smaller area than the first display substrate SUB1.

The second display substrate SUB2 overlaps with the first display substrate SUB1. Liquid crystals LC are injected into a space between the first display substrate SUB1 and the second display substrate SUB2 to form a liquid-crystal layer LCL between the first display substrate SUB1 and the second display substrate SB2.

A surface of the first display substrate SUB1 that faces the second display substrate SUB2 may be divided into a display area DA and a non-display area NDA. The display area DA may be defined as an area where a plurality of pixels PXs for displaying an image is disposed. Accordingly, an image to be displayed may be displayed entirely within the display area DA. The non-display area NDA may be defined as the area of the first display substrate SUB1 that is not the display area DA.

The display area DA may be disposed entirely within an area where the first display substrate SUB1 and the second display substrate SUB2 overlap. For example, the second display substrate SUB2 may fully correspond to the display area DA of the first substrate SUB1 or the second display substrate SUB2 may cover a portion of the non-display area NDA as well as an entirety of the display area DA. The plurality of pixels PXs may be arranged in a matrix pattern along the first direction D1 and the second direction D2, which may be substantially perpendicular to each other. In an exemplary embodiment of the present disclosure, the pixels PXs may include first to third pixel types representing red color, green color and blue color pixels, respectively. In some exemplary embodiments of the present disclosure, the pixels PXs may include yellow color, cyan color, and a magenta color pixels, respectively. Furthermore, the pixels PXs may include white pixels for displaying white as well.

The gray scale of each pixel PX may be individually controlled. Each of the pixels PX may work as a unit for displaying a particular color. The grayscale of each of the pixels PXs can be controlled by adjusting the amount of incident light that travels from below the first display substrate SUB1 toward the second display substrate SUB2.

Various components for driving the pixels PXs, such as a drive IC may be mounted in the non-display area NDA.

Display devices include liquid-crystal display devices, organic light-emitting display device, etc. and each type of display device may have a unique structure of the pixels PXs. In the following description, it is assumed that the display device is a liquid-crystal display device. However, it is to be noted that the technical idea of exemplary embodiments of the present disclosure may equally applied to organic light-emitting display device as well.

The structure of each of the pixels PXs will be described in detail with reference to FIGS. 2 and 3.

Figure 2:
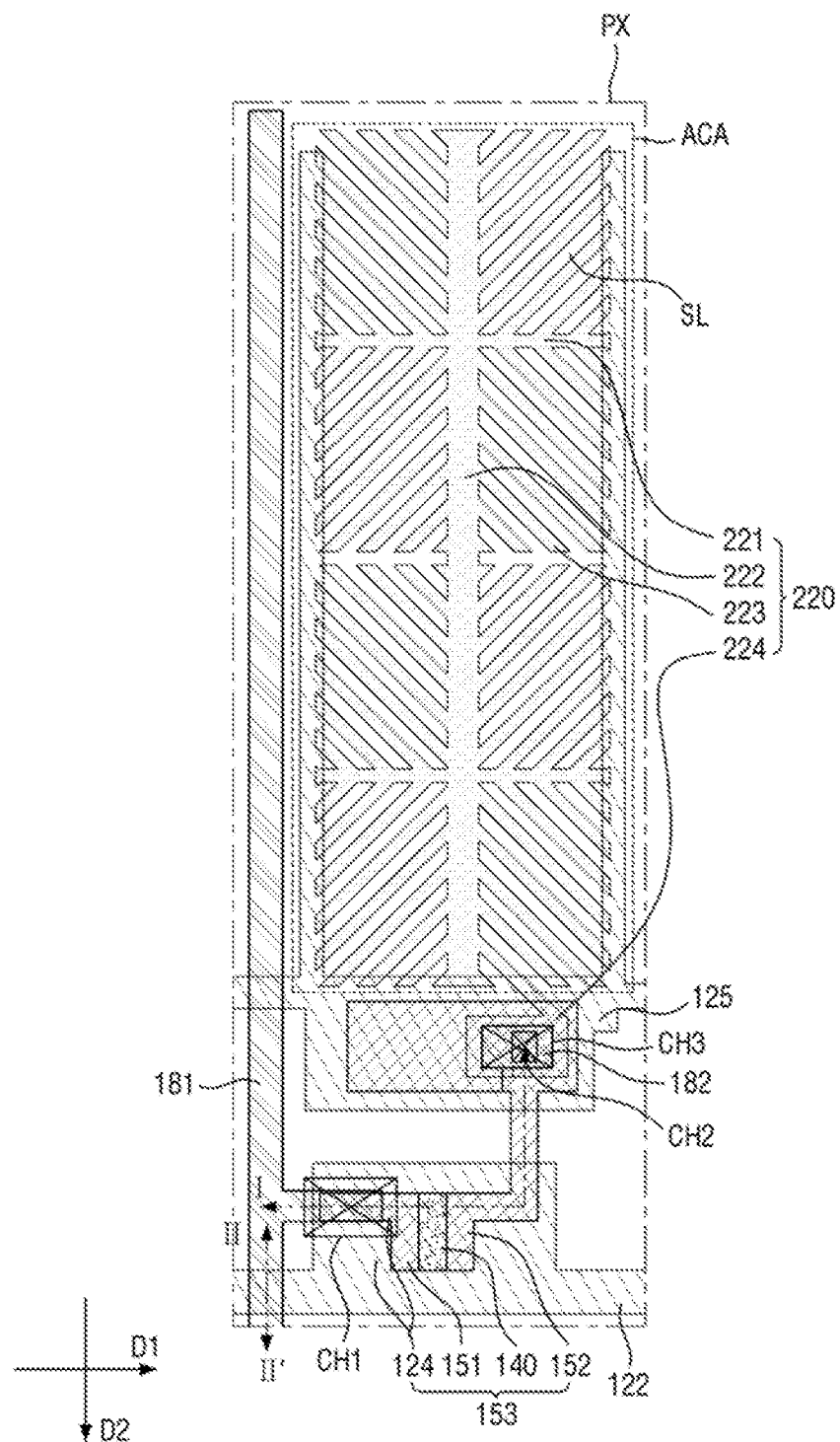
FIG. 2 is a layout diagram illustrating a single pixel disposed in a display panel according to an exemplary embodiment of the present disclosure.

FIG. 2 is a layout diagram illustrating a single pixel disposed in a display panel according to an exemplary embodiment of the present disclosure. FIG. 3 is a cross-sectional view taken along line I-I' of FIG. 2.

Figure 3:
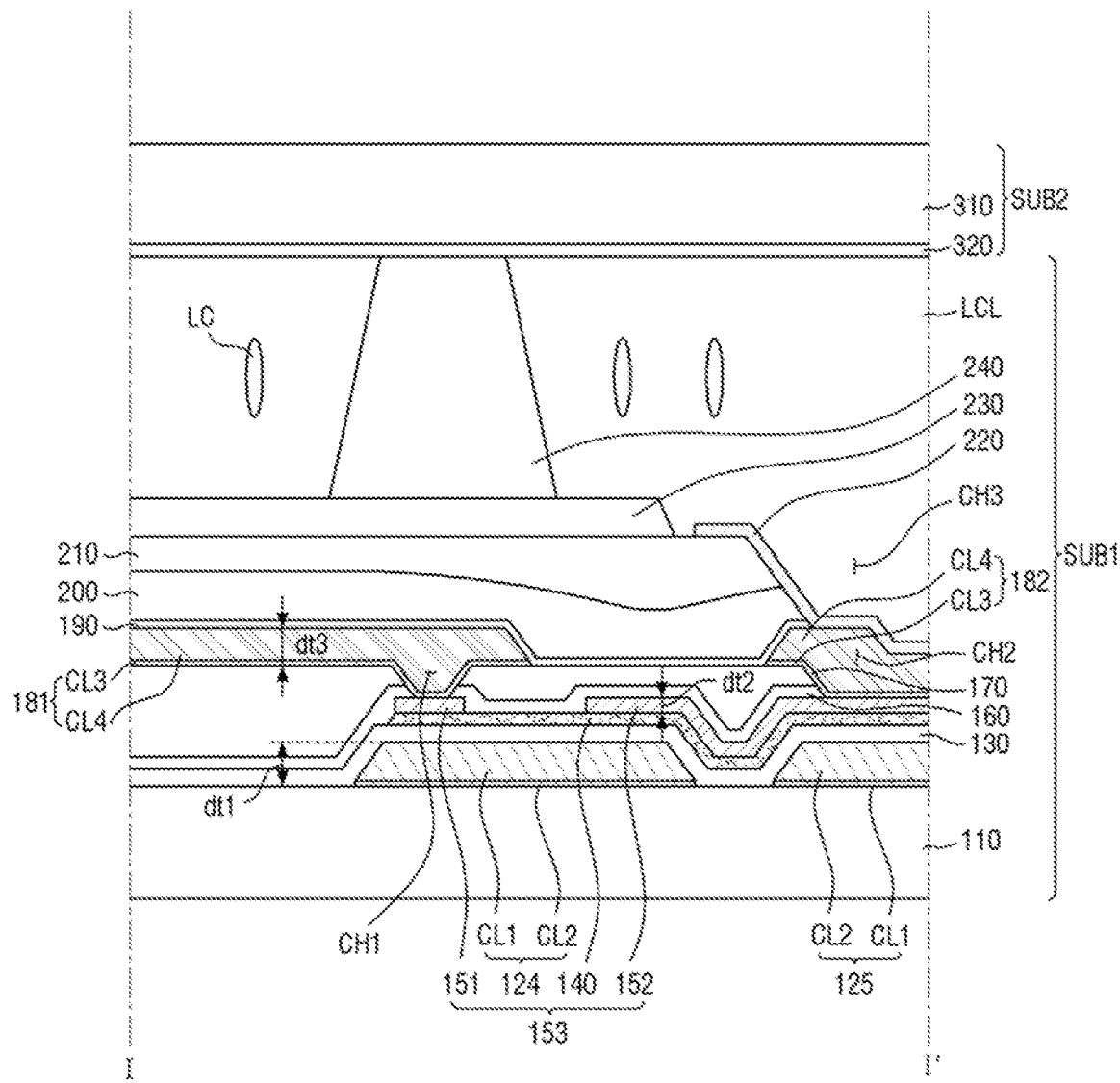
FIG. 3 is a cross-sectional view taken along line I-I' of FIG. 2.

Referring to FIGS. 2 and 3, one pixel PX of the display panel, according to an exemplary embodiment of the present disclosure, includes a first display substrate SUB1, a second display substrate SUB2, and a liquid-crystal layer LCL. Each of the pixels PXs includes an active area ACA through which light is transmitted.

Various components for changing the orientation of the liquid crystals LC in the liquid-crystal layer LCL, such as a pixel electrode 220 and a thin-film transistor 153 may be disposed on the first display substrate SUB1.

The second display substrate SUB2 faces the first display substrate SUB1. On the second display substrate SUB2, a common electrode 320 is disposed on a second base substrate 310 so as to face the pixel electrode 220.

The liquid-crystal layer LCL is interposed between the first display substrate SUB1 and the second display substrate SUB2 and may include liquid crystals LC having dielectric anisotropy. When electric field is applied across the first display substrate SUB1 and the second display substrate SUB2, the liquid crystals LC may be rotated in a particular direction between the first display substrate SUB1 and the second display substrate SUB2 to thereby change the polarization of light passing therethrough. Herein, the term rotation may refer not only to actual rotation of the liquid crystals LC but also to any change in orientation of the liquid crystals LC caused by the electric field.

Hereinafter, the first display substrate SUB1 will be described.

The first display substrate SUB1 includes a first base substrate 110. The first base substrate 110 may be a transparent insulation substrate. For example, the first base substrate 110 may be a glass substrate, a quartz substrate, a transparent resin substrate, etc.

According to some exemplary embodiments of the present invention, the first base substrate 110 may be curved in a particular direction. In some exemplary embodiments of the present invention, the first base substrate 110 may be flexible. For example, the first base substrate 110 may be deformable so that it may be rolled, folded, bent and so on.

A gate line 122, a gate electrode 124 and a sustain line 125 are each disposed on the first base substrate 110.

The gate line 122 transfers a gate voltage for controlling the thin-film transistor 153. The gate line 122 may be extended in a first direction D1.

The gate voltage is applied from an external source and may have a varying voltage level. The thin-film transistor 153 may be turned on and/or off in response to the voltage value of the gate signal.

The gate electrode 124 may protrude from the gate line 122 and may be mechanically and electrically connected to the gate line 122. The gate line 124 may be one of the elements of the thin-film transistor 153 which is described in greater detail below.

The sustain line 125 is disposed such that it does not overlap with the gate line 122, and the sustain line 125 extends primarily in the first direction D1 along the edge of the active area ACA. The sustain line 125 may be disposed adjacent to a part of the pixel electrode 220, as is described in greater detail below. A capacitance may be formed between the pixel electrode 220 and the sustain line 125. In addition, the sustain line 125 may overlap with a part of a connection electrode 182, as is described in greater detail below. A capacitance may be formed between the connection electrode 182 and the sustain line 125. Accordingly, it is possible to prevent a rapid drop in the voltage level across the connection electrode 182 and the pixel electrode 220. However, the sustain line 125 may be omitted if the drop of the voltage level applied to the pixel electrode 220 does not adversely affect the display quality or is otherwise acceptable even without the sustain line 125.

The gate line 122, the gate electrode 124 and the sustain line 125 may each be include a same material. The gate line 122, the gate electrode 124 and the sustain line 125 may each have a single layer structure. Alternatively, the gate line 122, the gate electrode 124 and the sustain line 125 may each have a multi-layer structure including at least two conductive layers having different physical properties.

In the latter case, a first conductive layer CL1 disposed between a second conductive layer CL2 and the first base substrate 110, may include indium zinc oxide (IZO), indium tin oxide (ITO), gallium zinc oxide (GZO), and/or zinc aluminum oxide (ZAO). However, the above-listed materials are merely illustrative as other materials, such as titanium (Ti), may be used.

The second conductive layer CL2 is disposed on the first conductive layer CL1. The second conductive layer CL2 may include an aluminum-based metal such as aluminum (Al) or an aluminum alloy, a silver-based metal such as silver (Ag) or an silver alloy, a gold-based metal such as gold (Au) or a gold alloy, a copper-based material such as copper (Cu) or a copper alloy, a molybdenum-based metal such as molybdenum (Mo) or a molybdenum alloy, chromium (Cr), tantalum (Ta) and titanium (Ti), etc.

The first conductive layer CL1 fixes the second conductive layer CL2 so that it is not easily separated from the first base substrate 110, and the first conductive layer CL1 also works as a passage through which the gate voltage is transferred. The second conductive layer CL2 works as a passage through which the gate voltage is mainly transferred. The cross section of the second conductive layer CL2 may be thicker than the cross section of the first conductive layer CL1.

A gate insulating layer 130 is disposed on the gate line 122, the gate electrode 124 and the sustain line 125. The gate insulating layer 130 may include an insulative material, for example, silicon nitride or silicon oxide. The gate insulating layer 130 may have a single layer structure or may have a multi-layer structure including two insulating layers having different physical properties. The gate insulating layer 130 may prevent electrical connection from being formed between the gate line 122, the gate electrode 124, the sustain line 125, and/or other components disposed thereon.

A semiconductor layer 140 is disposed on the gate insulating layer 130. The semiconductor layer 140 may overlap with at least a part of the gate electrode 124. The semiconductor layer 140 may include amorphous silicon, polycrystalline silicon or oxide semiconductor.

The semiconductor layer 140 may overlap with the gate electrode 124, as well as a source electrode 151 and a drain electrode 152, as is described below.

Although not shown in the drawings, in some exemplary embodiments of the present invention, an ohmic contact element may be additionally disposed on the semiconductor layer 140. The ohmic contact element may include n+ hydrogenated amorphous silicon that is highly doped with n-type impurities, or may include silicide. A pair of such ohmic contact elements may be disposed on the semiconductor layer 140. The ohmic contact element may be disposed between the source electrode 151 and the semiconductor layer 140 and between the drain electrode 152 and semiconductor layer 140, so that the ohmic contact elements may have ohmic contact characteristics. When the semiconductor layer 140 includes an oxide semiconductor, the ohmic contact element may be omitted.

The source electrode 151 and the drain electrode 152 may each be disposed on the semiconductor layer 140.

The source electrode 151 may overlap with at least part of the semiconductor layer 140. The drain electrode 152 may overlap with at least part of the semiconductor layer 140. The source electrode 151 may be spaced apart from the drain electrode 152 by a predetermined distance.

The source electrode 151 may supply a data voltage from a data line 181 to the semiconductor layer 140. The drain electrode 152 may supply the data voltage from the semiconductor layer 140 to the pixel electrode 220.

The data voltage is applied from an external source and may have a varying voltage level. The gray scale of each of the pixels PXs can be controlled by setting the level of the data voltage.

Each of the source electrode 151 and the drain electrode 152 may include titanium (Ti) and/or molybdenum (Mo). The thickness dt2 of the cross section of each of the source electrode 151 and the drain electrode 152 may be less than or equal to half the thickness dt1 of the cross section of each of the gate electrode 124 and the gate line 122. Alternatively, the source electrode 151 and the drain electrode 152 may be less than or equal to half the thickness dt3 of the cross section of the data line 181.

The gate electrode 124, the semiconductor layer 140, the source electrode 151 and the drain electrode 152 may form the switching element, e.g., the thin-film transistor 153.

A first passivation layer 160 is disposed on both the source electrode 151 and the drain electrode 152. The first passivation layer 160 may include an inorganic insulating material and may cover the thin-film transistor 153. The first passivation layer 160 may protect the thin-film transistor 153 and may prevent materials of a first insulating layer 170 from being introduced into the semiconductor layer 140. In some embodiments, the first passivation layer 160 may be omitted.

The first insulating layer 170 is disposed on the first passivation layer 160.

The first insulating layer 170 may include an insulating material and may be an organic layer including, for example, an organic material. The first insulation film 170 may reduce height differences created by the elements disposed between the first base substrate 110 and the first insulating layer 170, so as to provide a flat, planar surface. Accordingly, the upper surface of the second insulating layer 170 may be substantially flat.

The data line 181 and the connection electrode 182 are each disposed on the first insulating layer 170.

The data line 181 may receive the data voltage from an external source to supply the data voltage to the source electrode. The data line 181 may extend through a first contact hole CH1 formed in the first insulating layer 170 to be electrically connected to the source electrode 151. The data line 181 may extend primarily in the second direction D2.

The connection electrode 182 may receive the data voltage from the drain electrode 152 and supply the data voltage to the pixel electrode 220. The connection electrode 182 may extend through a second contact hole CH2 formed in the first insulating layer 170 to electrically connect the drain electrode 152 with the pixel electrode 220. The connection electrode 182 may overlap an area where the second contact hole CH2 is formed.

The data line 181 and the connection electrode 182 may each include the same material. The data line 181 and the connection electrode 182 may have a single layer structure. Alternatively, the data line 181 and the connection electrode 182 may each have a multi-layer structure including at least two conductive layers having different physical properties.

In the latter case, a third conductive layer CL3 disposed at the bottom may include indium zinc oxide (IZO), indium tin oxide (ITO), gallium zinc oxide (GZO), and/or zinc aluminum oxide (ZAO). The above-listed materials are merely illustrative and other materials, such as titanium (Ti), may be used.

A fourth conductive layer CIA disposed on the third conductive layer CL3 may include an aluminum-based metal such as aluminum (Al) or an aluminum alloy, a silver-based metal such as silver (Ag) or an silver alloy, a gold-based metal such as gold (Au) or a gold alloy, a copper-based material such as copper (Cu) or a copper alloy, a molybdenum-based metal such as molybdenum (Mo) or a molybdenum alloy, chromium (Cr), tantalum (Ta) and titanium (Ti), etc.

The third conductive layer CL3 fixes the fourth conductive layer CIA so that it is not easily separated from the first insulating layer 170, the source electrode 151 and the drain electrode 152, and also works as a passage through which the data voltage is transferred. The fourth conductive layer CL4 works as a passage through which the data voltage is mainly transferred. The cross section of the fourth conductive layer CL4 may be thicker than the cross section of the third conductive layer CL3.

The thickness dt3 of the cross section of each of the data line 181 and the connection electrode 182 may be larger than the thickness dt2 of the cross section of each of the source electrode 151 and the drain electrode 152. For example, the thickness dt2 of the cross section of each of the source electrode 151 and the drain electrode 152 may smaller than the thickness dt3 of the cross section of each of the data line 181 and the connection electrode 182. For example, the thickness dt2 of the cross section of each of the source electrode 151 and the drain electrode 152 may be less than or equal to half the thickness dt3 of the cross section of each of the data line 181 and the connection electrode 182.

As such, by making the thickness dt2 of the cross section of each of the source electrode 151 and the drain electrode 152 relatively small while making the thickness dt3 of the cross section of each of the data line 181 and the connection electrode 182 relatively large, it is the charging rate, which represents how much the initially supplied data voltage is transferred to the pixel electrode 220, may be increased.

A second passivation layer 190 is disposed on the data line 181 and the connection electrode 182. The second passivation layer 190 may include an inorganic insulating material and may cover the data line 181 and the connection electrode 182. The second passivation layer 190 may protect the data line 181 and the connection electrode 182 and prevent the material of a second insulating layer 210 or a color filter layer 200 from infiltrating into a layer where the data line 181 and the connection electrode 182 are disposed. In some exemplary embodiments of the present disclosure, the second passivation layer 190 may be omitted.

The color filter layer 200 is disposed on the second passivation layer 190. The color filter layer 200 may be a photosensitive organic composition containing a pigment for reproducing a color and may include at least one of a red, green or blue pigment. It is to be understood that the colors of the pigments are not limited to red, green and blue.

The second insulating layer 210 is disposed on the color filter layer 200. The second insulating layer 210 may include an insulating material and may be an organic layer including an organic material, for example. The second insulating layer 210, like the first insulating layer 170, may reduce height differences created by the elements disposed between the first base substrate 110 and the second insulating layer 210, to provide a flat surface. Accordingly, the upper surface of the second insulating layer 210 may be substantially flat.

The pixel electrode 220 is disposed on the second insulating layer 210.

The pixel electrode 220 may extend through a third contact hole CH3 formed in the second insulating layer 210 to be electrically connected to the connection electrode 182. The pixel electrode 220 may receive the data voltage from the connection electrode 182.

The pixel electrode 220 may include a transparent conductive material such as indium tin oxide (ITO), indium zinc oxide (IZO), indium tin zinc oxide (ITZO), Al-doped zinc oxide (AZO).

The pixel electrode 220 may be disposed primarily in the active area ACA but may additionally be disposed in an area that extends to overlap the third contact hole CH3 for connection with the connection electrode 182, for example, an extension electrode 224.

The pixel electrode 220 may include slits which are opened portions where no transparent conductive material is disposed. By virtue of the slits SL, a regular pattern is formed in the pixel electrode 220. The direction and degrees that the liquid crystals LC above the pixel electrode 220 are tilted may be controlled by the shape and the pattern of the pixel electrode 220.

The pixel electrode 220 includes first stem electrodes 221, a second stem electrode 222, branch electrodes 222, and an extension electrode 224.

Most of the elements of the pixel electrode 220 may be disposed in the active area ACA. However, the extension electrode 224 may be disposed outside of the active area ACA.

The first stem electrodes 221 may extend along the first direction D1 in the active area ACA. Although one pixel PX includes two first stem electrodes 221, in the configuration shown in FIG. 2, the number of the first stem electrodes 221 may be different in some exemplary embodiments of the present.

The second stem electrode 222 may be extended in the second direction D2 in the active area ACA. As the first stem electrodes 221 are extended in the first direction D1 in the active area ACA and the second stem electrode 222 is extended in the second direction D2 in the active area ACA, the first stem electrodes 221 and the second stem electrode 222 may intersect each other. Although one pixel PX includes one second stem electrode 222 in the configuration shown in FIG. 2, the number of the second stem electrode 222 may be different in some exemplary embodiments of the present invention.

The plurality of branch electrodes 223 may be disposed in the active area ACA and may extend from the first stem electrodes 221 or the second stem electrode 222. Generally, the branch electrodes 223 may be extended away from the intersections between the first stem electrodes 221 and the second stem electrode 222. The slits SL may correspond to opened portions between the first stem electrodes 221 and the branch electrodes 223 and between the second stem electrode 222 and the branch electrodes 223.

The extension electrode 224 may be extended from some of the branch electrodes 223 and may be extended beyond the active area ACA. The extension electrode 224 may be disposed out of the active area ACA such that the extension electrode 224 overlaps with the third contact hole CH3 formed in the second insulating layer 210. For example, the extension electrode 224 may conform to the shape of the side walls of the third contact hole CH3. The pixel electrode 220 may receive the data voltage from the connection electrode 182 via the extension electrode 224.

A first alignment layer may be additionally disposed on the pixel electrode 220. The first alignment layer may control an initial orientation angle of the liquid crystals LC injected into the liquid-crystal layer LCL.

A light blocking element 230 may be disposed on the pixel electrode 220.

The light blocking element 230 may overlap a part of the gate line 122, the data line 181, the first contact hole CH1 and the thin-film transistor 153. The light blocking element 230 may block incident light from the first base substrate 110. Further, by the various components on the first base substrate 110 that contain metal materials which do not transmit light as well as the light blocking element 230, the transmission of light in areas other than the active area ACA can be blocked. A spacer 240 is disposed on the light blocking element 230.

The spacer 240 may maintain the gap between the first display substrate SUB1 and the second display substrate SUB2. In some exemplary embodiments of the present invention, the spacer 240 may overlap at least a part of the thin-film transistor 153.

Hereinafter, the effect of increasing the charging rate by using the cross-sectional structure of the first display substrate SUB1 will be described in detail. In the structure, the source electrode 151 and the data line 181 are separated from each other and are electrically connected to each other only via a first contact hole CH1. The drain electrode 152 and the connection electrode 182 are separated from each other and are electrically connected to each other only via a second contact hole CH2.

The first insulating layer 170 is disposed between the gate electrode 124 and the data line 181, and the first insulating layer 170 is disposed between the gate electrode 124 and the connection electrode 182, such that the distance between the gate electrode 124 and the data line 181 increases, and the distance between the gate electrode 124 and the data connection electrode 182 also increases. Accordingly, the capacitance between the gate electrode 124 and the data line 181 may be reduced, and the capacitance between the gate electrode 124 and the connection electrode 182 may be reduced. In addition, if the dielectric constant of the first insulating layer 170 is lower than that of the gate electrode 124, the data line 181 and the connection electrode 182, the dielectric constant is reduced, such that capacitance between the gate electrode 124 and the data line 181 can be reduced, and the capacitance between the gate electrode 124 and the connection electrode 182 can be reduced. Accordingly, the RC delay of the data voltage supplied through the data line 181 and the connection electrode 182 decreases, and thus the charging rate can be increased. As the charging rate is increased, the display quality of the display device can be increased.

The data line 181 and the connection electrode 182 are each disposed on the substantially flat upper surface of the first insulating layer 170, and thus the gate electrode 124, the gate line 122, the data line 181 and the connection electrode 182 all can be formed relatively thick (e.g., as measured in cross section). As a result, the resistance can be reduced. For example, as the first insulating layer 170 provides the flat surface for the data line 181 and the connection electrode 182, it is possible to form the gate line 122 and the gate electrode 124 to be relatively thick so as to reduce the resistance, while reducing the height difference created by the gate line 122 and the gate electrode 124. Accordingly, the risk that the data line 181 and the connection electrode 182 are damaged, such as by cracks, may be reduced, and it is possible to reduce the resistance by forming the data line 181 and the connection electrode 182 to be relatively thick. By doing so, the resistance of the gate electrode 124, the data line 181 and the connection electrode 182 can be reduced, and the RC delay of the data voltage, which is provided through the data line 181 and the connection electrode 182, can be reduced. As a result, the charging rate can be increased. As the charging rate is increased, the display quality of the display device can be increased.

The source electrode 151 and the data line 181 may include different materials and may be formed in different layers. The drain electrode 152 and the connection electrode 182 may include different materials and may be formed in different layers, such that the channel length of the thin-film transistor 153 can be reduced. The channel length is defined as a distance between the drain electrode 152 and the source electrode 151 of the thin-film transistor 153. The shorter the channel length is, the better the data voltage is transferred from the source electrode 151 to the drain electrode 152, and thus the charging rate can be increased. For example, when the thickness of the cross-section of the source electrode 151 and the drain electrode 152 is increased, the distance between the source electrode 151 and the drain electrode 152 is increased in order to increase the margin between the two electrodes. As a result, the channel length may become longer. In contrast, according to an exemplary embodiment of the present disclosure, the thickness of the cross-section of the source electrode 151 and the drain electrode 152 is relatively thin, so that the margin can be reduced and the channel length can become shorter. In addition, according to an exemplary embodiment of the present disclosure, the data line 181 connected to the source electrode 151 and the connection electrode 182 connected to the drain electrode 152 are formed in different layers, so that the thickness of the cross section of the data line 181 and the drain electrode 152 become thick while the channel length can be reduced, to thereby increase the charging rate and the display quality of the display device.

Hereinafter, the second display substrate SUB2 will be described.

The second display substrate SUB2 includes the second base substrate 310 and the common electrode 320.

The second base substrate 310 may be disposed such that it faces the first base substrate 110. The second base substrate 310 may be highly durable so that it can withstand external impact. The second base substrate 310 may be a transparent insulation substrate. For example, the second base substrate 310 may be a glass substrate, a quartz substrate, a transparent resin substrate, etc. Although the second base substrate 310 may be a flat plate, the present invention is not limited to this particular arrangement. It is to be understood that the second base substrate 310 may be curved in a particular direction.

The common electrode 320 is disposed on the surface of the second base substrate 310 that faces the first display substrate SUB1.

Like the pixel electrode 220, the common electrode 320 may include a transparent conductive material such as indium tin oxide (ITO), indium zinc oxide (ZO), indium tin zinc oxide (ITZO) and/or Al-doped zinc oxide (AZO).

Unlike the pixel electrode 220 that is disposed at each of the pixels PXs and has opened portions in the complicated pattern, however, the common electrode 320 may be formed throughout the entire surface of the second base substrate 310 as a single, continuous plate.

The common electrode 320 may receive a common signal from an external source and may form an electric field across the liquid-crystal layer LCL together with the pixel electrode 220.

The common signal may be supplied from an external source, and the voltage level of the common signal may be kept constant while the LCD device is driven. Accordingly, electric field may be formed between the pixel electrode 220 and the common electrode 320 overlapping each other due to a height difference between the data voltage supplied to the pixel electrode 220 and the common voltage supplied to the common electrode 320. The liquid crystals LC may be rotated or tilted by the electric field.

A second alignment layer may be disposed on the surface of the common electrode 320 that faces the first display substrate SUB1. Similar to the first alignment layer, the second alignment layer may control the initial orientation angle of the liquid crystals LC injected into the liquid-crystal layer LCL.

Hereinafter, the liquid-crystal layer LCL will be described.

The liquid-crystal layer LCL may include liquid crystals LC having dielectric anisotropy and refractive anisotropy. The liquid crystals LC may be aligned vertically with respect to the first display substrate SUB1 and the second display substrate SUB2 when no electric field is applied. When electric field is formed between the first display substrate SUB1 and the second display substrate SUB2, the liquid crystals LC may be rotated or tilted in a particular direction between the first display substrate SUB1 and the second display substrate SUB2 to thereby change the polarization of light.

Although the vertically-aligned LCD device has been described with reference to FIGS. 2 and 3 where the liquid crystals LC are initially orientated in the direction perpendicular to the first display substrate SUB1 and the second display substrate SUB2, the technical idea of the present disclosure is not limited thereto. For example, the cross sectional structure including the first insulating layer 170, according to an exemplary embodiment of the present disclosure, may be equally applied to a horizontally-aligned LCD device where liquid crystals LC are initially orientated in parallel with the surface of the first display substrate SUB1 and the second display substrate SUB2. Also in this case, it is possible to achieve the effect of increasing the charging rate and accordingly increasing the display quality.

FIGS. 4 to 11 are cross-sectional views showing processing steps of a method of manufacturing the display panel shown in FIGS. 2 and 3.

FIGS. 4, 6, 8 and 10 are cross-sectional views taken along line I-I' of FIG. 2. FIGS. 5, 7, 9 and 11 are cross-sectional views taken along line II-II' of FIG. 2.

Figure 4:
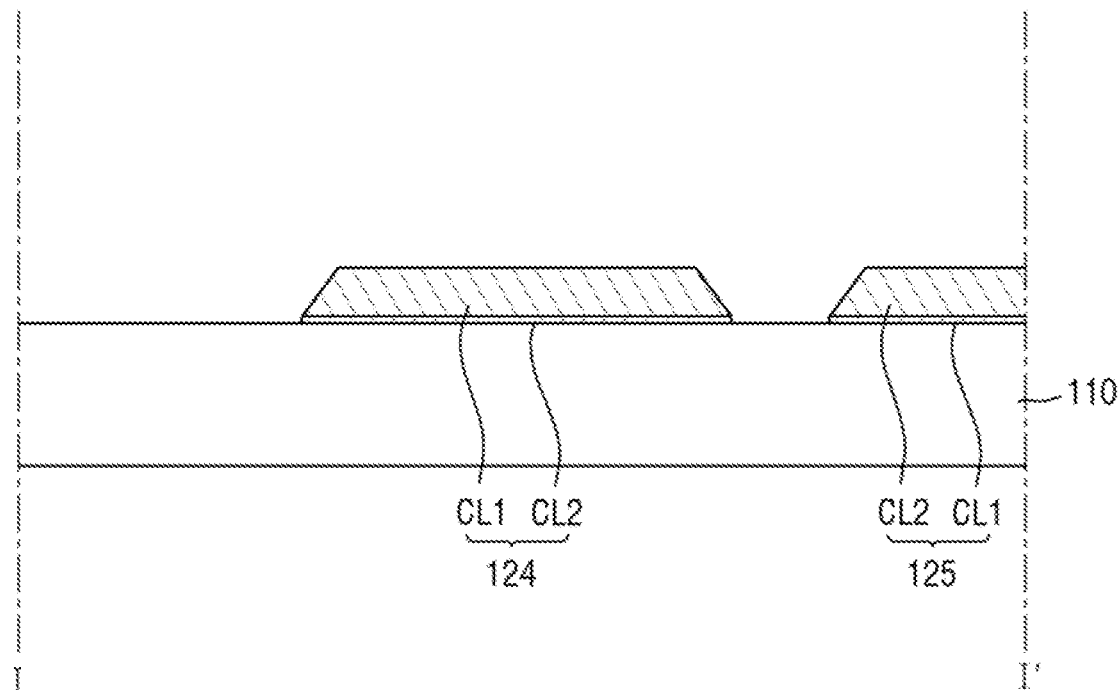
FIGS. 4 to 11 are cross-sectional views illustrating processing steps of a method of manufacturing the display panel shown in FIGS. 2 and 3.
Figure 5:
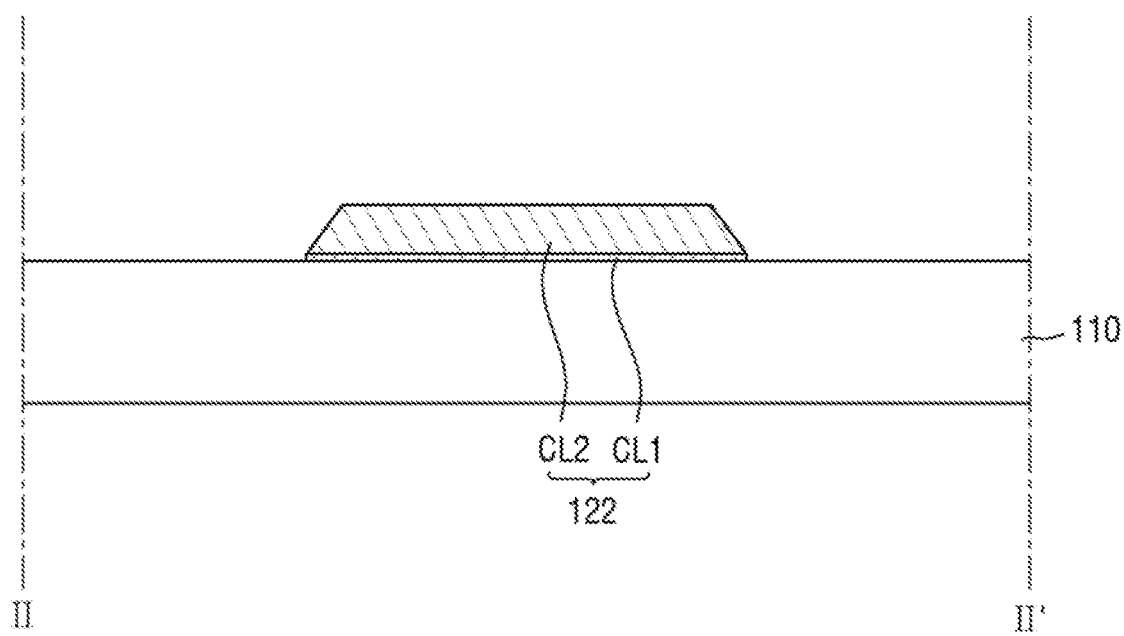

Referring to FIGS. 4 and 5, a gate line 122, a gate electrode 124 and a sustain line 125 are formed on a first base substrate 110. As described above, the gate line 122, the gate electrode 124 and the sustain line 125 may include a same material and may each have a multi-layer structure including a first conductive layer CL1 and a second conductive layer.

The thickness of the cross section of the gate line 122, the gate electrode 124 and the sustain lines 125 may range from approximately 5,000 Å to 20,000 Å. For example, when the gate line 122, the gate electrode 124 and the sustain line 125 each have a multi-layer structure including the first conductive layer CL1 and the second conductive layer CL2, the first conductive layer CL1 may include indium zinc oxide (IZO), indium tin oxide (ITO), gallium zinc oxide (GZO) and/or zinc aluminum oxide (ZAO) and may have a cross-sectional thickness of approximately 100 Å to 1,000 Å. In addition, the second conductive layer CL2 may include an aluminum-based metal such as aluminum (Al) or an aluminum alloy, a silver-based metal such as silver (Ag) or a silver alloy, a gold-based metal such as gold (Au) or a gold alloy, a copper-based material such as copper (Cu) or a copper alloy, a molybdenum-based metal such as molybdenum (Mo) or an molybdenum alloy, chromium (Cr), tantalum (Ta) and titanium (Ti), and may have a thickness of approximately 5,000 Å to 20,000 Å.

The gate line 122, the gate electrode 124 and the sustain line 125 are stacked by sputtering, chemical vapor deposition (CVD), plasma enhanced chemical vapor deposition (PECVD), etc. and may be formed by patterning.

For example, after depositing two metal layers and then applying a photoresist composition on the metal layers, the photoresist composition is exposed to light so that it has a pattern conforming to the shapes of the gate line 122, the gate electrode 124 and the sustain line 125. Subsequently, the two metal layers are etched sequentially to form the gate line 122, the gate electrode 124 and the sustain line 125.

Figure 6:
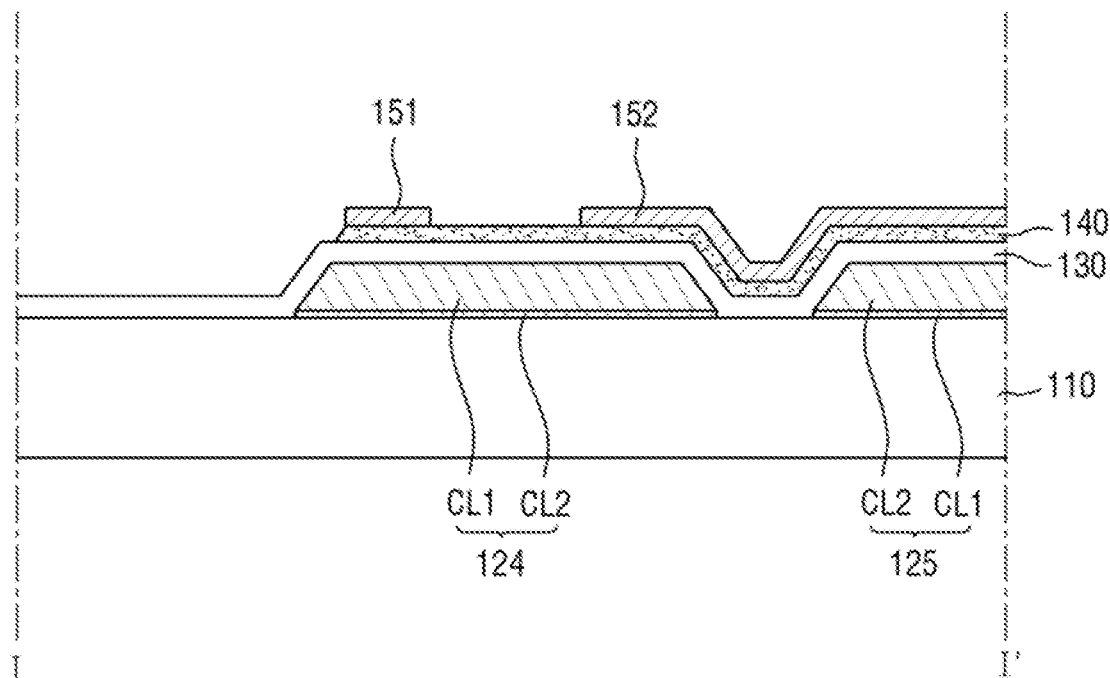
Figure 7:
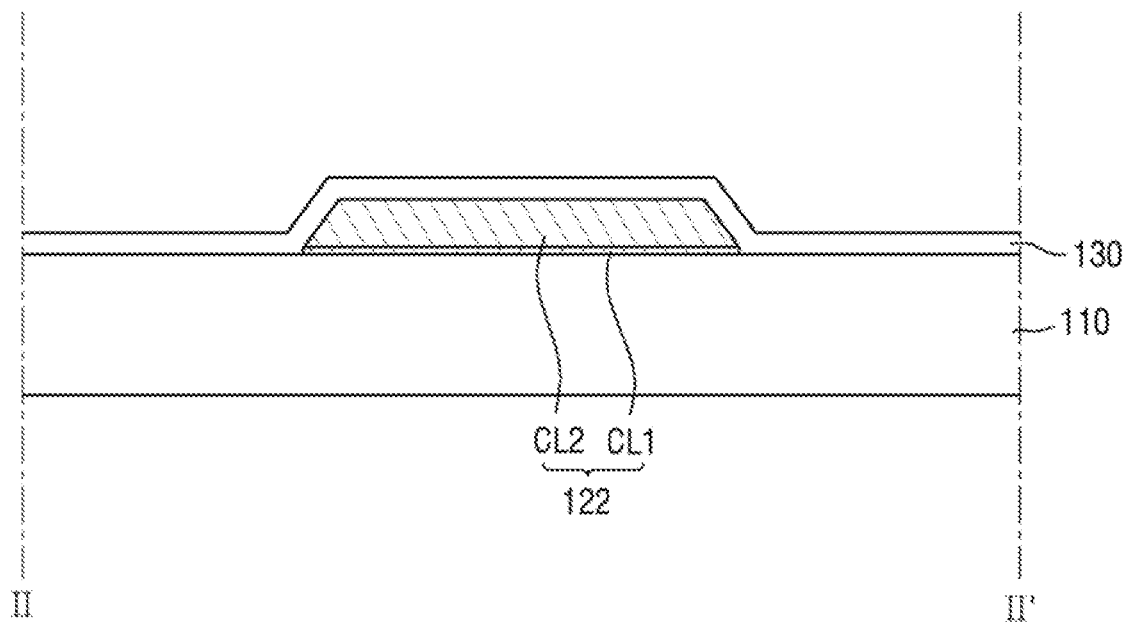

Then, Referring to FIGS. 6 and 7, a gate insulating layer 130, a semiconductor layer 140 disposed on the gate insulating layer 130, a source electrode 151 and a drain electrode 152 disposed on the semiconductor layer 140 are sequentially formed.

The gate insulating layer 130 may include an inorganic insulating material as described above.

After the gate insulating layer 130 is formed, the semiconductor layer 140 is formed on the gate insulating layer 130. The semiconductor layer 140 may include amorphous silicon, polycrystalline silicon or oxide semiconductor.

The source electrode 151 and the drain electrode 152 disposed on the semiconductor layer 140 may be simultaneously formed using the same mask as is used to form the semiconductor layer 140.

For example, after a semiconductor material layer is stacked on the gate insulating layer 130, a metal layer forming the source electrode 151 and the drain electrode 152 is stacked on the semiconductor material layer. Subsequently, a photoresist composition is applied onto the metal layer, and then exposure is performed with a slit mask such that the photoresist composition has the largest thickness where the source electrode 151 and the drain electrode 152 are disposed, has a relatively small thickness where the channel is formed, and is entirely removed in the rest of the area. Then, the metal layers and the semiconductor material layer are sequentially etched, such that the source electrode 151, the drain electrode 152 and the semiconductor layer 140 can be formed.

The thickness of the cross section of the source electrode 151 and the drain electrode 152 may range from approximately 500 Å to 2,000 Å, for example.

Figure 8:
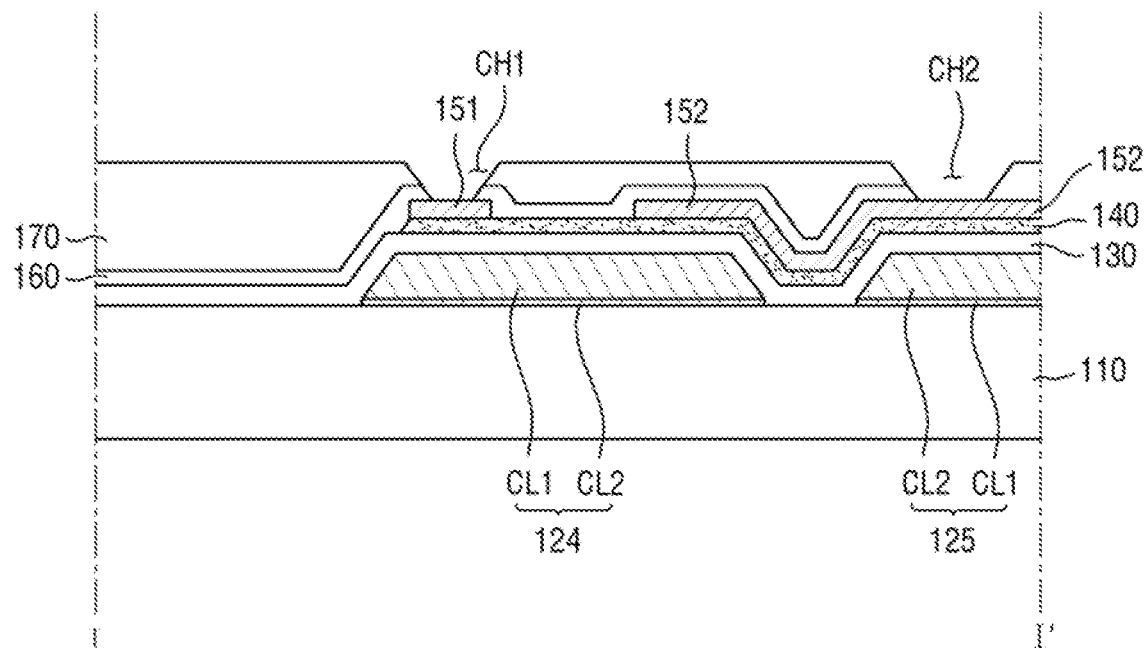
Figure 9:
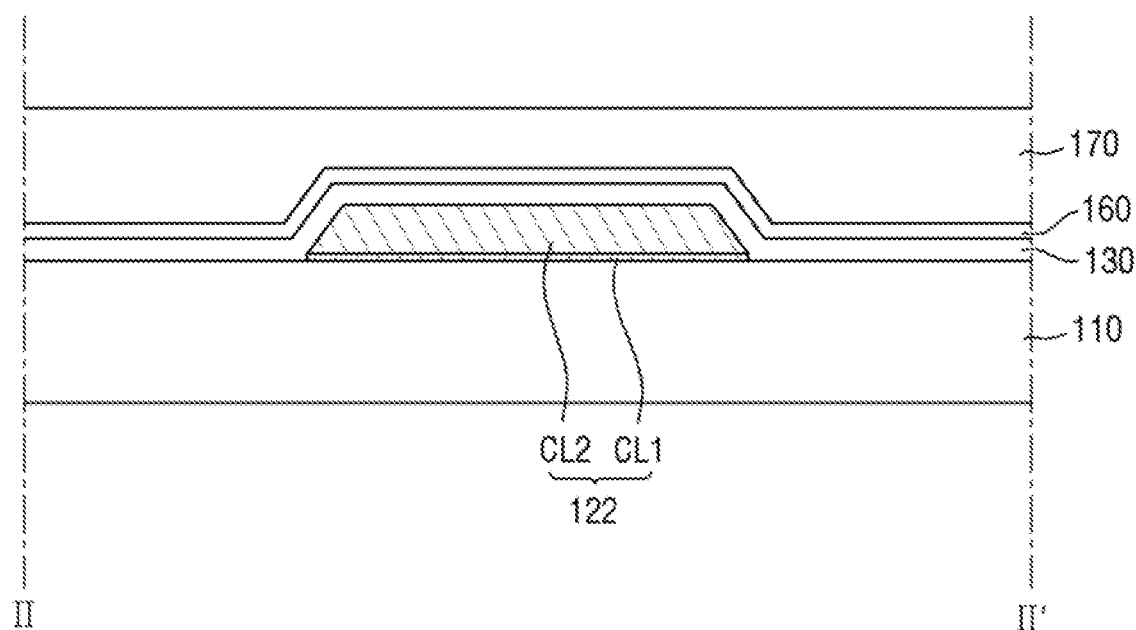

Subsequently, referring to FIGS. 8 and 9, a source electrode 151, a first passivation layer 160 disposed on the source electrode 151, and a first insulating layer 170 disposed on the first passivation layer 160 are sequentially formed.

First, a first passivation material layer including a constituent material for the first passivation layer 160 is stacked on the source electrode 151 and the drain electrode 152. Then, a first insulating material layer including an organic material for the first insulating layer 170 is stacked on the first passivation material layer.

Exposure is performed on the stacked first passivation material layer and the first insulating material layer with a mask having a pattern conforming to the first contact hole CH1 and the second contact hole CH2, and then first contact hole CH1 and the second contact hole CH2 are formed, such that the first passivation layer 160 and the first insulating layer 170 can be formed.

Figure 10:
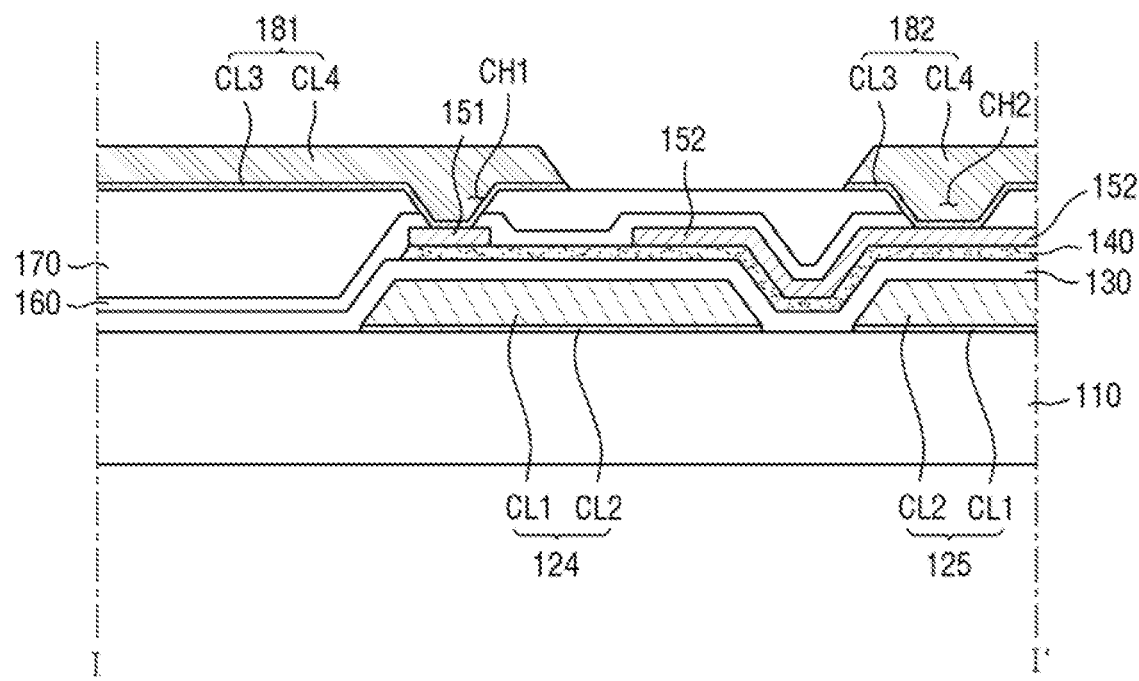
Figure 11:
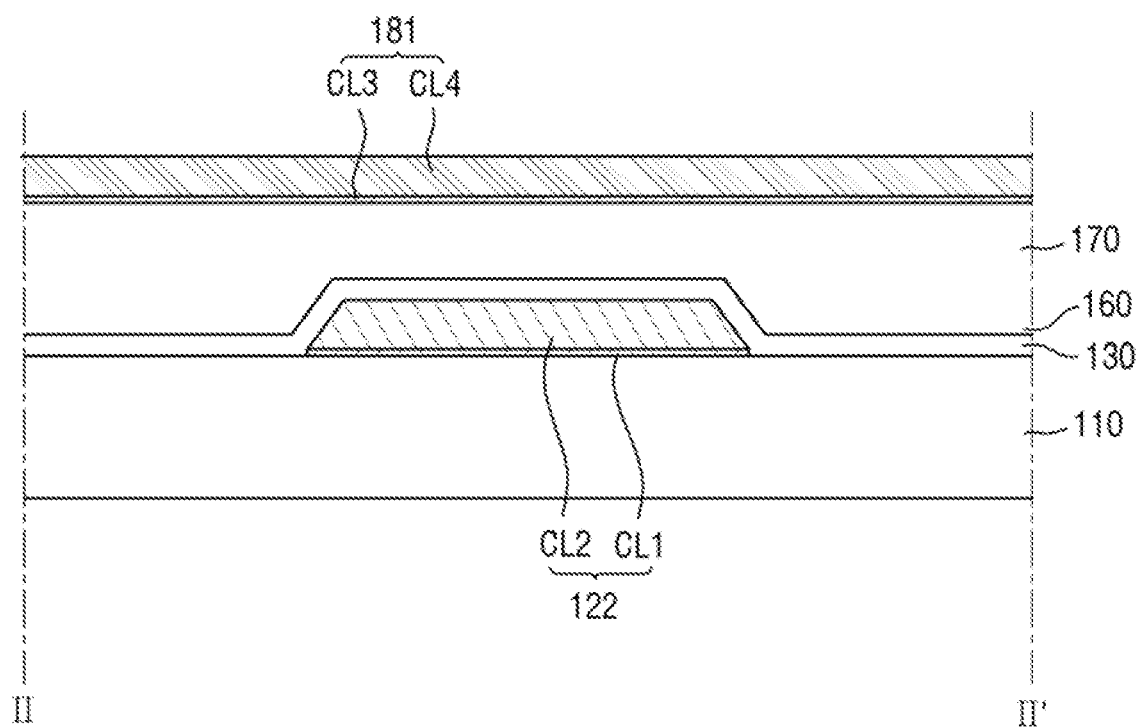

Subsequently, referring to FIGS. 10 and 11, a data line 181 and a connection electrode 182 are formed on the first insulating layer 170. The data line 181 and the connection electrode 182 may include the same material as described above, and may have a multi-layer structure including a third conductive layer CL3 and a fourth conductive layer CL4.

The thickness of the cross section of the data line 181 and the connection electrode 182 may range from approximately 5,000 Å to 20,000 Å. For example, when the data line 181 and the connection electrode 182 have a multi-layer structure including the third conductive layer CL3 and the fourth conductive layer CL4, the third conductive layer CL3 may include indium zinc oxide (IZO), indium tin oxide (ITO), gallium zinc oxide (GZO), and/or zinc aluminum oxide (ZAO) and may have a cross-sectional thickness of approximately 100 Å to 1,000 Å. In addition, the fourth conductive layer CIA may be made up of an aluminum-based metal such as aluminum (Al) or an aluminum alloy, a silver-based metal such as silver (Ag) or a silver alloy, a gold-based metal such as gold (Au) or a gold alloy, a copper-based metal such as copper (Cu) or a copper alloy, a molybdenum-based metal such as molybdenum (Mo) or an molybdenum alloy, chromium (Cr), tantalum (Ta) and titanium (Ti), and may have a thickness of approximately 5,000 Å to 20,000 Å.

The data line 181 and the connection electrode 182 are stacked by sputtering, chemical vapor deposition (CVD), plasma enhanced chemical vapor deposition (PECVD), etc. and may be formed by patterning.

For example, after depositing two metal layers and then applying a photoresist composition on the metal layers, the photoresist composition is exposed to light so that the photoresist composition has a pattern conforming to the shapes of the data line 181 and the connection electrode 182. Subsequently, the two metal layers are etched sequentially to form the data line 181 and the connection electrode 182.

After forming the data line 181 and the connection electrode 182, a color filter layer 200, a second insulating layer 210, a pixel electrode 220, a light blocking element 230 and a spacer 240 are formed so that a display panel having the structure shown in FIG. 3 can be manufactured.

Figure 12:
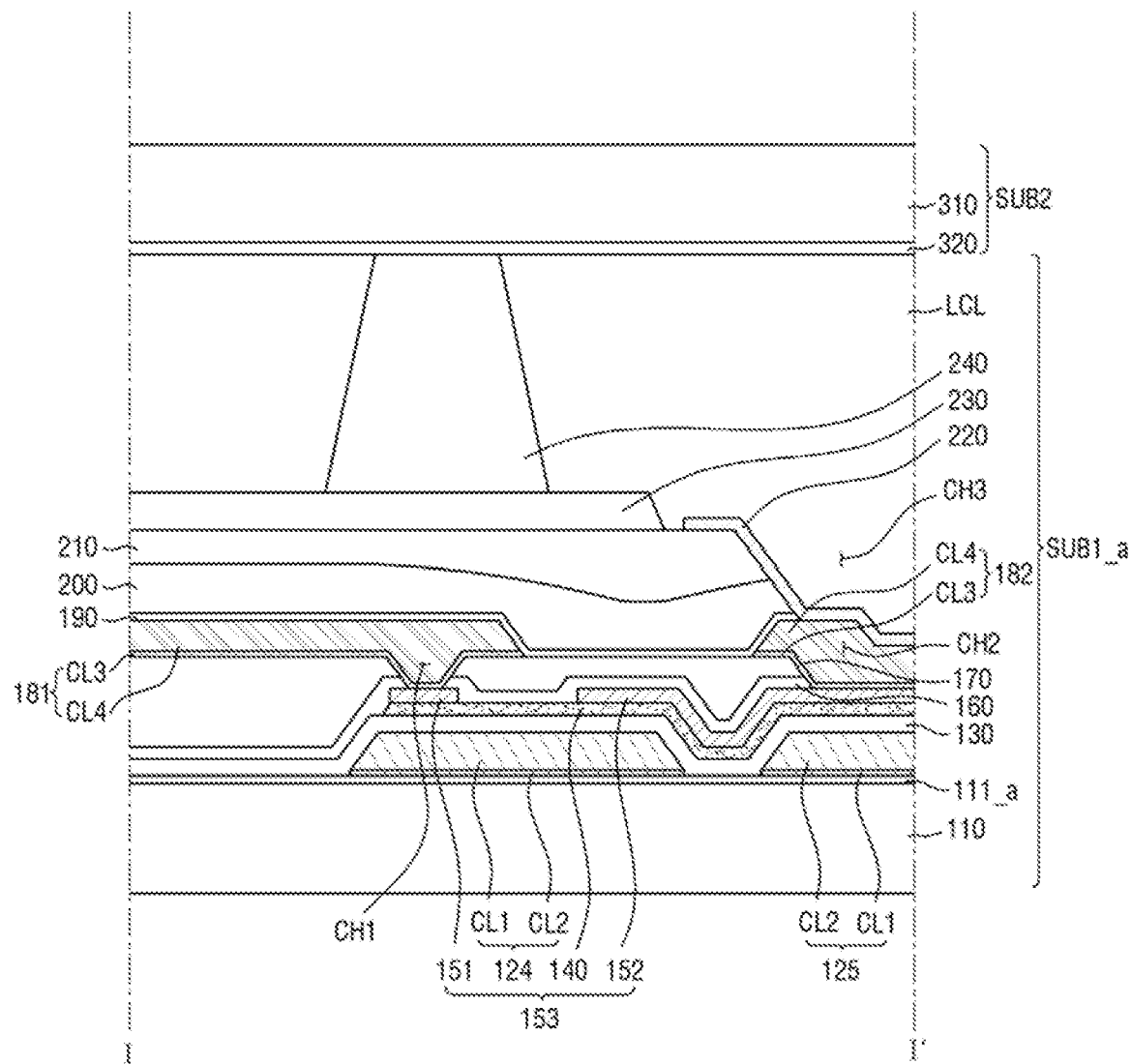
FIG. 12 is a cross-sectional view illustrating a pixel of a display panel according to an exemplary embodiment of the present disclosure, taken along line I-I' of FIG. 2.

FIG. 12 is a cross-sectional view illustrating a pixel of a display panel according to an exemplary embodiment of the present disclosure, taken along line I-I' of FIG. 2.

The cross-sectional view of the display panel illustrated in FIG. 12 may be different from the cross-sectional view of the display panel shown in FIG. 3 in that the former further includes a reinforcing layer 111. Therefore, descriptions will be focused on differences, and the redundant description will be omitted. It may be assumed that any omitted details are similar to or the same as corresponding details described above with respect to FIG. 3.

Referring to FIG. 12, a pixel PX of the display panel, according to an exemplary embodiment of the present disclosure, includes a first display substrate SUB1_a, a second display substrate SUB2, and a liquid-crystal layer LCL.

The first display substrate SUB1_a includes a first base substrate 110, an reinforcing layer 111_a, a gate line 122, a gate electrode 124, a sustain line 125, a gate insulating layer 130, a semiconductor layer 140, a source electrode 151, a drain electrode 152, a first passivation layer 160, a first insulating layer 170, a data line 181, a connection electrode 182, a second passivation layer 190, a color filter layer 200, a second insulating layer 210, a pixel electrode 220, a light blocking element 230, and a spacer 240.

Among these elements, only the reinforcing layer 111_a might be different from what is described above with reference to FIG. 3; and, therefore, the redundant description will be omitted.

The reinforcing layer 111_a is disposed on the first base substrate 110.

The reinforcing layer 111 may be implemented as a thin film including silicon nitride ($SiN_x$). The reinforcing layer 111_a may have a higher strength than the first base substrate 110 and may reduce or prevent the deformation of the first base substrate 110 that may occur in the process of forming various components on the reinforcing layer 111_a.

For example, if the thickness dt1 of the cross section of the gate line 122, the gate electrode 124 and the sustain line 125 (see FIG. 3) ranges from approximately 5,000 Å to 20,000 Å, or the thickness dt3 of the data line 181 and the connection electrode 182 (see FIG. 3) ranges from approximately 5,000 Å to 20,000 Å, the degrees of deformation of the elements may differ from the degree of deformation of the first base substrate 110, such that the first base substrate 110 may be bent. This bending may be prevented by additionally including the reinforcing layer 111_a.

Figure 13:
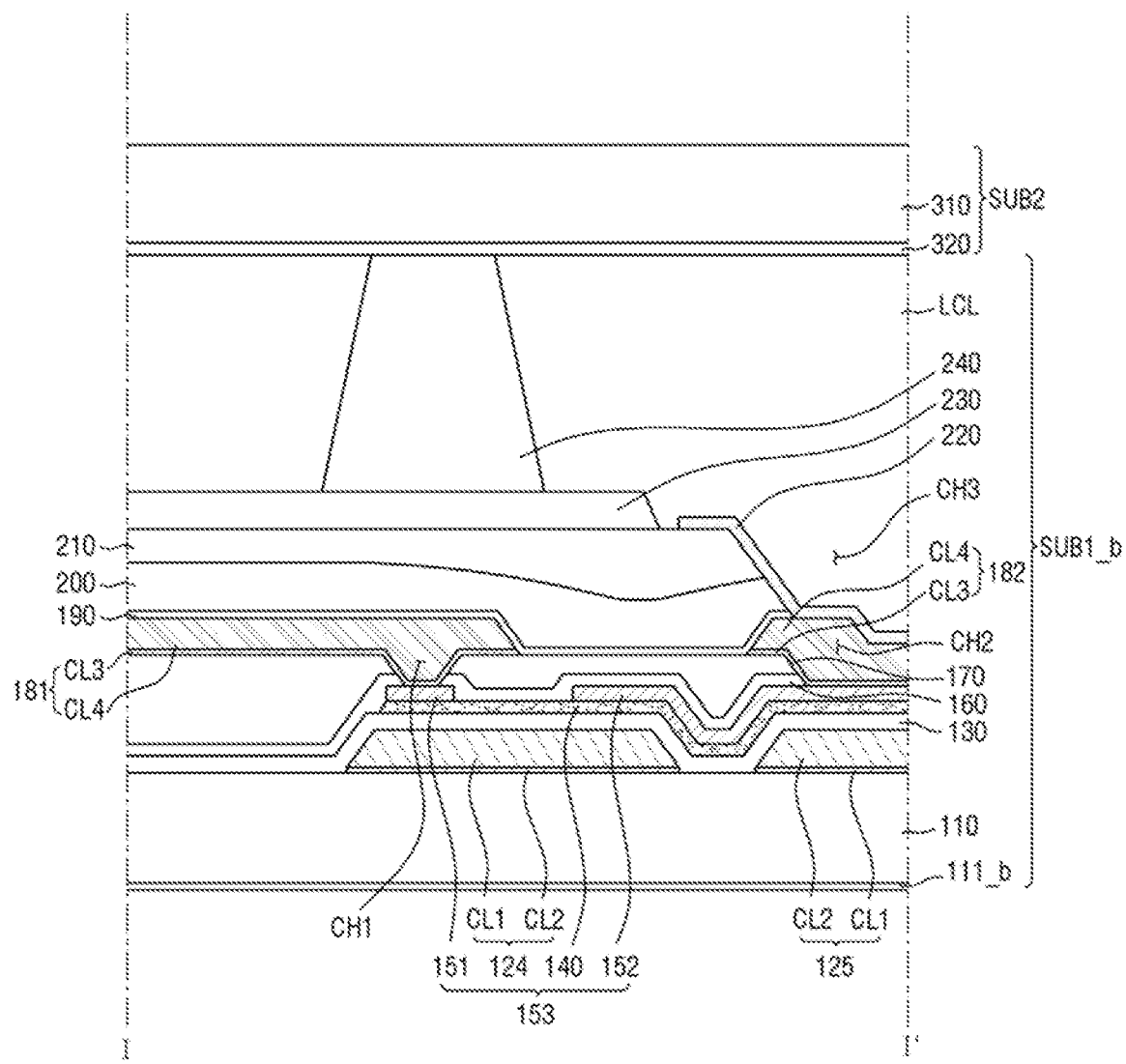
FIG. 13 is a cross-sectional view illustrating a pixel of a display panel according to an exemplary embodiment of the present disclosure, taken along line I-I' of FIG. 2.

FIG. 13 is a cross-sectional view illustrating a pixel of a display panel according to an exemplary embodiment of the present disclosure, taken along line I-I' of FIG. 2.

The cross-sectional view of the display panel according to FIG. 13 is different from the cross-sectional view of the display panel shown in FIG. 12 in that a reinforcing layer 111_b is located at a different position. Therefore, descriptions will be focused on differences, and the redundant description will be omitted. It may be assumed that any omitted details are similar to or the same as corresponding details described above with respect to the prior figures.

Referring to FIG. 13, a pixel PX of the display panel, according to an exemplary embodiment of the present disclosure, includes a first display substrate SUB1_b, a second display substrate SUB2, and a liquid-crystal layer LCL.

The first display substrate SUB1_b includes a first base substrate 110, an reinforcing layer 111_b, a gate line 122, a gate electrode 124, a sustain line 125, a gate insulating layer 130, a semiconductor layer 140, a source electrode 151, a drain electrode 152, a first passivation layer 160, a first insulating layer 170, a data line 181, a connection electrode 182, a second passivation layer 190, a color filter layer, a second insulating layer 210, a pixel electrode 220, a light blocking element 230, and a spacer 240.

Among them, only the reinforcing layer 111_b might be different from those elements described above with reference to FIG. 3; and, therefore, the redundant description will be omitted.

The reinforcing layer 111_b is disposed on the first base substrate 110. For example, the reinforcing layer 111_b is formed on a surface of the first base substrate 110 that is opposed to the surface facing the first base substrate 110 on which the gate line 122, the gate electrode 124k the sustain line 125, etc. are disposed.

The reinforcing layer 111_b may be implemented as a thin film including silicon nitride ($SiN_x$). The reinforcing layer 111_b may have a higher strength than the first base substrate 110 and may reduce or prevent the deformation of the first base substrate 110 that may occur in the process of forming various components on the reinforcing layer 111_b. That is, the reinforcing layer 111_b may include the same material as the reinforcing layer 111_a in FIG. 12 included in the display panel according to the configuration shown in FIG. 12, and may perform the same functionality.

Figure 14:
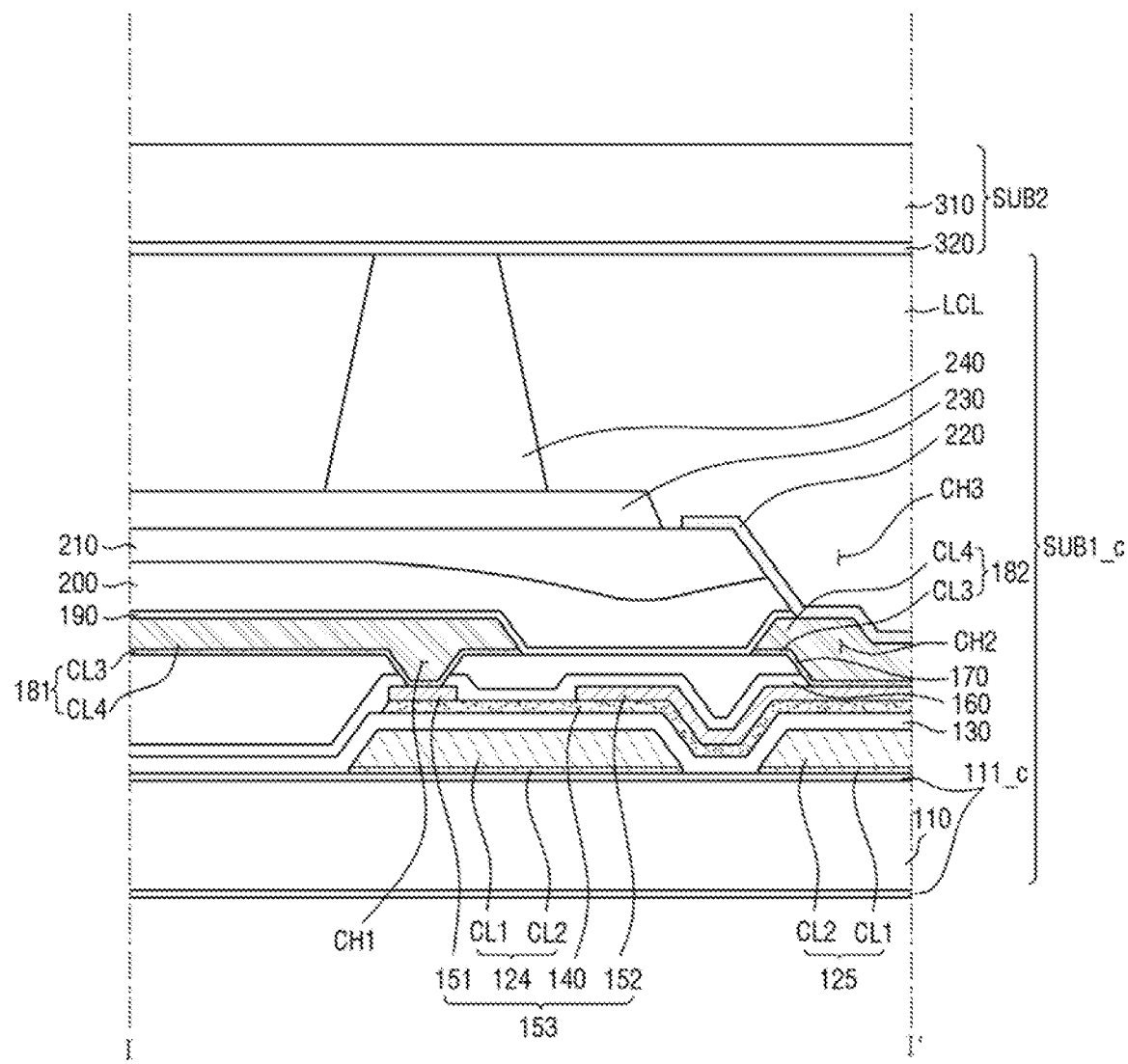
FIG. 14 is a cross-sectional view illustrating a pixel of a display panel according to an exemplary embodiment of the present disclosure, taken along line I-I' of FIG. 2.

FIG. 14 is a cross-sectional view illustrating a pixel of a display panel according to an exemplary embodiment of the present disclosure, taken along line I-I' of FIG. 2.

The cross-sectional view of the display panel illustrated in FIG. 14 is different from the cross-sectional views of the display panels shown in FIGS. 12 and 13 in that a plurality of reinforcing layers 111_c is formed. Therefore, descriptions will be focused on differences, and the redundant description will be omitted. It may be assumed that any omitted details are similar to or the same as corresponding details described above with respect to the prior figures.

Referring to FIG. 14, a pixel PX of the display panel, according to an exemplary embodiment of the present disclosure, includes a first display substrate SUB1_c, a second display substrate SUB2, and a liquid-crystal layer LCL.

The first display substrate SUB1_c includes a first base substrate 110, reinforcing layers 111_c, a gate line 122, a gate electrode 124, a sustain line 125, a gate insulating layer 130, a semiconductor layer 140, a source electrode 151, a drain electrode 152, a first passivation layer 160, a first insulating layer 170, a data line 181, a connection electrode 182, a second passivation layer 190, a color filter layer, a second insulating layer 210, a pixel electrode 220, a light blocking element 230, and a spacer 240.

Only the reinforcing layers 111_c might be different from those elements described above with reference to FIG. 3; and, therefore, the redundant description will be omitted. It may be assumed that any omitted details are similar to or the same as corresponding details described above with respect to the prior figures.

One of the reinforcing layers 111_c is disposed on a surface of the first base substrate 110, and the other of the reinforcing layers 111_c is disposed on an opposed surface of the first base substrate 110. For example, the reinforcing layers 111_c are disposed on both surfaces of the first base substrate 110.

The reinforcing layers 111_c may be implemented as a thin film including silicon nitride ($SiN_x$). The reinforcing layers 111_c may have a higher strength than the first base substrate 110 and may reduce or prevent the deformation of the first base substrate 110 that may occur in the process of forming various components on the reinforcing layers 111_c. For example, the reinforcing layers 111_c may include the same material as the reinforcing layer 111_a in FIG. 12 included in the display panel shown in FIG. 12, and may perform the same functionality.

Figure 15:
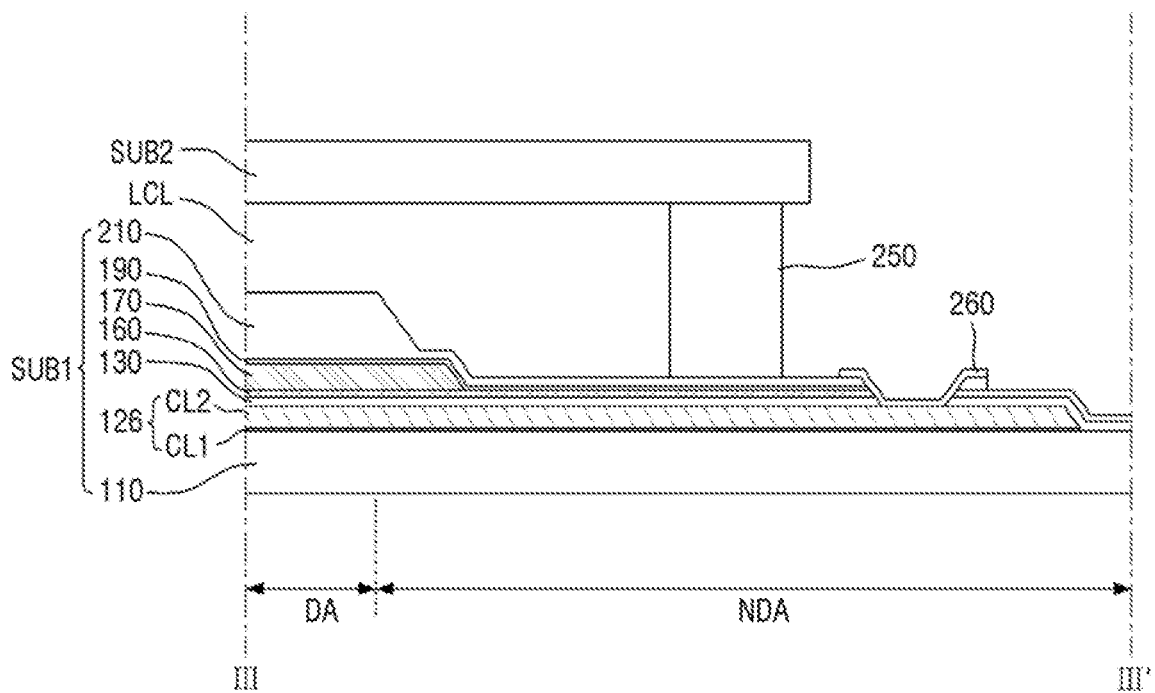
FIG. 15 is a cross-sectional view illustrating a display panel according to an exemplary embodiment of the present disclosure, taken along line III-III' of FIG. 1.

FIG. 15 is a cross-sectional view of a display panel according to an exemplary embodiment of the present disclosure, taken along line III-III' of FIG. 1.

For example, FIG. 15 shows a portion of the end of the display area DA and the non-display area NDA.

Referring to FIG. 15, the display panel, according to an exemplary embodiment of the present disclosure, includes a first display substrate SUB1, a second display substrate SUB2 and a liquid-crystal layer LCL.

The first display substrate SUB1 includes a first base substrate 110, a pad line 126, a gate insulating layer 130, a first passivation layer 160, a first insulating layer 170, a second passivation layer 190, a second insulating layer 210, a sealant 250, and a pad electrode 260.

The first base substrate 110 may be identical to that of FIG. 3; and, therefore, the redundant description will be omitted. It may be assumed that any omitted details are similar to or the same as corresponding details described above with respect to the prior figures.

The pad line 126 is disposed on the first base substrate 110. The pad line 126 may include the same material as the gate line 122, the gate electrode 124 and the sustain line 125, and may be formed in the same layer. Accordingly, the pad line 126 may have a multi-layer structure including the first conductive layer CL1 and the second conductive layer CL2.

The pad line 126 may be electrically connected to the gate line 122 or the data line 181 in the display area DA to transfer the gate voltage or the data voltage supplied from an external source to the gate line 122 or the data line 181, respectively. Accordingly, the pad line 126 may be disposed to extend to the non-display area NDA.

The gate insulating layer 130 is disposed on the pad line 126. The gate insulating layer 130 may be disposed to overlap the non-display area NDA. It may be assumed that the other features of the gate insulating layer 130 are similar to or the same as corresponding details described above with respect to FIG. 3. A first passivation layer 160 is disposed on the gate insulating layer 130. The first passivation layer 160 may be disposed to overlap the non-display area NDA. It may be assumed that the other features of the gate first passivation layer 160 are similar to or the same as corresponding details described above with respect to FIG. 3.

The first insulating layer 170 is disposed on the first passivation layer 160. The first insulating layer 170 may overlap with the display area DA and a relatively small part of the non-display area NDA. For example, the area where the first insulating layer 170 overlaps with the non-display area NDA may be smaller than the area where the first passivation layer 160 overlaps with the non-display area NDA. It may be assumed that the other features of the first insulating layer 170 are similar to or the same as corresponding details described above with respect to FIG. 3.

The second passivation layer 190 is disposed on the first insulating layer 170. The second passivation layer 190 may be disposed to overlap the non-display area NDA. It may be assumed that the other features of the second passivation layer 190 are similar to or the same as corresponding details described above with respect to FIG. 3.

The second insulating layer 210 is disposed on the second passivation layer 190. The second insulating layer 210 may be disposed to overlap the non-display area NDA. The thickness of the cross section of the second insulating layer 210 may decrease gradually from the display area DA to the non-display area NDA. It may be assumed that the other features of the second insulating layer 210 are similar to or the same as corresponding details described above with respect to FIG. 3.

The sealant 250 is disposed on the second insulating layer 210. The sealant 250 may seal the liquid crystals LC of the liquid-crystal layer LCL disposed between the first display substrate SUB1 and the second display substrate SUB2 so that the liquid crystals LC do not leak from their area.

In addition, the pixel electrode 260 is disposed on the second insulating layer 210. The pad electrode 260 may include a conductive metal and may be electrically connected to the pad line 126 through a fourth contact hole CH4 that penetrates all the elements between the second insulating layer 210 and the gate insulating layer 130. The pad electrode 260 may receive various signals (for example, the data voltage or the gate voltage) supplied from an external source to the display panel, and provide it to the pad line 126.

Figure 16:
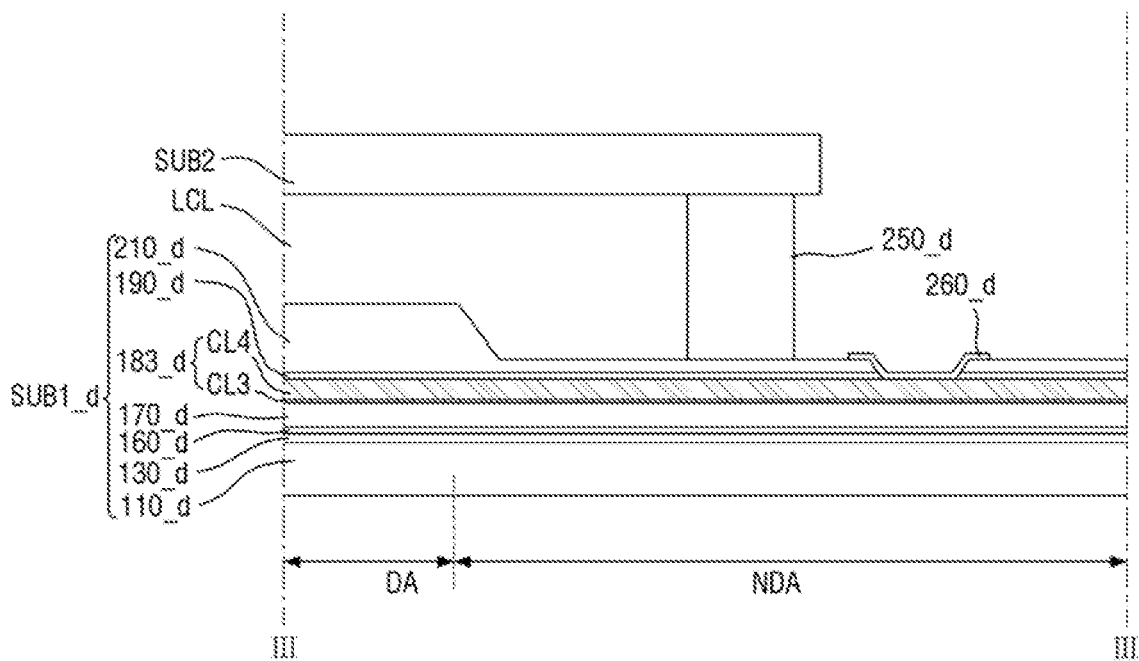
FIG. 16 is a cross-sectional view illustrating a display panel according to an exemplary embodiment of the present disclosure, taken along line III-III' of FIG. 1.

FIG. 16 is a cross-sectional view illustrating a display panel according to an exemplary embodiment of the present disclosure, taken along line III-III' of FIG. 1.

The cross-sectional view of the display panel according to this figure is different from the cross-sectional view of the display panel shown in FIG. 15 in that a pad electrode 260 is located at a different position. Therefore, descriptions will be focused on differences, and the redundant description will be omitted.

Referring to FIG. 16, the display panel, according to an exemplary embodiment of the present disclosure, includes a first display substrate SUB1_d, a second display substrate SUB2 and a liquid-crystal layer LCL.

The first display substrate SUB1_d includes a first base substrate 110, a pad line 183_d, a gate insulating layer 130_d, a first passivation layer 160_d, a first insulating layer 170_d, a second passivation layer 190_d, a second insulating layer 210_d, a sealant 250_d, and a pad electrode 260_d.

However, unlike the structure shown in FIG. 15, the pad line 183_d may be disposed on the first insulating layer 170_d. Accordingly, when the pad line 183_d is made up of multiple layers, it may include the third conductive layer CL3 and the fourth conductive layer CL4. In addition, as the pad line 183_d is disposed on the first insulating layer 170_d, the features disposed under the pad line 183_d (e.g., the first passivation layer 160_d, and the gate insulating layer 130_d) may overlap with the non-display area NDA.

In this manner, when the pad line 183_d is disposed on the first insulating layer 170_d, the thickness of the cross section of the liquid-crystal layer LCL disposed at the boundary between the display area DA and the non-display area NDA can be received. Accordingly, it is possible to prevent misalignment of the liquid crystals LC in the liquid-crystal layer LCL disposed at the boundary between the display area DA and the non-display area NDA, and thus light leakage can be suppressed.

Figure 17:
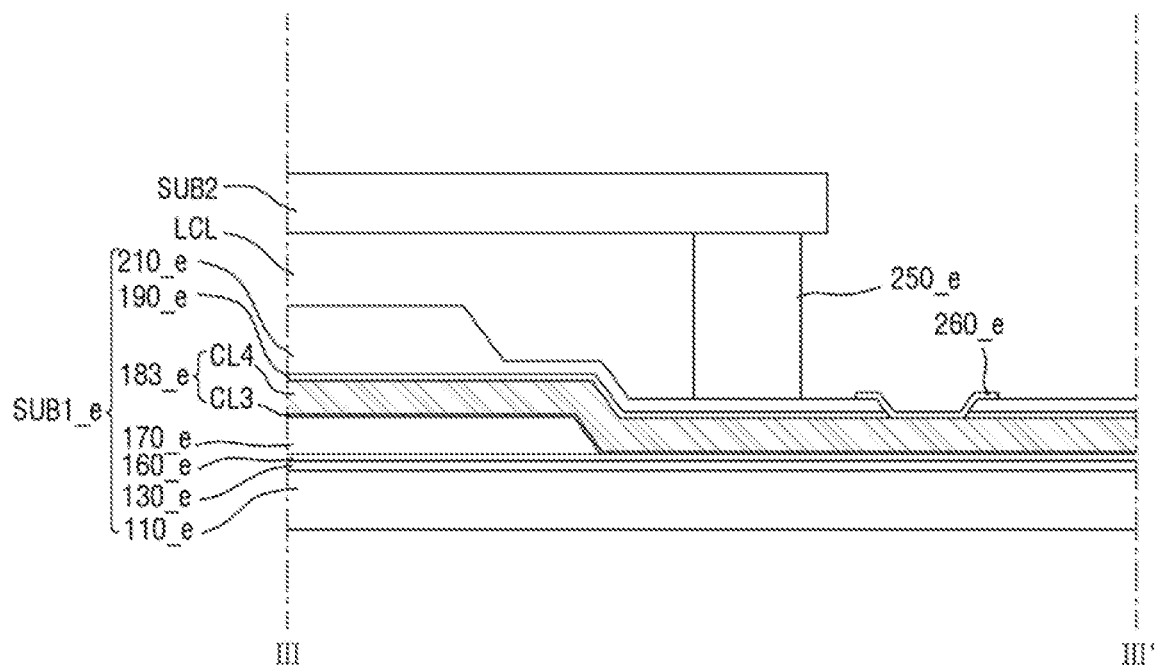
FIG. 17 is a cross-sectional view illustrating a display panel according to yet another exemplary embodiment of the present disclosure, taken along line III-III' of FIG. 1.

FIG. 17 is a cross-sectional view illustrating a display panel according to an exemplary embodiment of the present disclosure, taken along line III-III' of FIG. 1.

The cross-sectional view of the display panel according to this approach is different from the cross-sectional view of the display panel shown in FIG. 15 in that a first insulating layer 170_e is located at a different position. Therefore, descriptions will be focused on differences, and the redundant description will be omitted.

Referring to FIG. 17, the display panel, according to an exemplary embodiment of the present disclosure, includes a first display substrate SUB1_e, a second display substrate SUB2 and a liquid-crystal layer LCL.

The first display substrate SUB1_e includes a first base substrate 110, a pad line 183_e, a gate insulating layer 130_e, a first passivation layer 160_e, a first insulating layer 170_e, a second passivation layer 190_de a second insulating layer 210_e, a sealant 250_e, and a pad electrode 260_e.

Unlike the structure shown in FIG. 16, however, the pad line 183_e is disposed on the first insulating layer 170_e but the area where the first insulating layer 170_e disposed under the first insulating layer 170_e overlaps with the non-display area NDA can be reduced.

The first insulating layer 170_e may overlap with the display area DA and a relatively small part of the non-display area NDA. For example, the area where the first insulating layer 170_e overlaps with the non-display area NDA may be smaller than the area where the first passivation layer 160_e overlaps with the non-display area NDA. For example, while the pad line is disposed on the first insulating layer 170_e, the first insulating layer 170_e may have the same structure as shown in FIG. 15.

Exemplary embodiments described herein are illustrative, and many variations can be introduced without departing from the spirit of the disclosure or from the scope of the appended claims. For example, elements and/or features of different exemplary embodiments may be combined with each other and/or substituted for each other within the scope of this disclosure and appended claims.

What is claimed is:

1. A display panel comprising:
a base substrate;
a thin-film transistor disposed on the base substrate, the thin-film transistor including a first electrode, a second electrode, a third electrode, and a semiconductor layer overlapping the third electrode;
a first insulating layer disposed on both the first electrode and the second electrode; and
a signal line disposed on the first insulating layer,
wherein the signal line is electrically connected to the first electrode, via a first contact hole penetrating through the first insulating layer,
wherein the first contact hole overlaps the third electrode in a direction perpendicular to the surface of the base substrate,
wherein an upper surface of the first insulating layer is substantially planar,
wherein the first electrode includes a portion which directly contacts the semiconductor layer,
wherein the signal line includes a portion which directly contacts the first electrode, and
wherein the portion of the first electrode which directly contacts the semiconductor layer overlaps an entirety of the portion of the signal line which directly contacts the first electrode in the direction perpendicular to the surface of the base substrate.

2. The display panel of claim 1, wherein the portion of the first electrode and the portion of the signal line overlap the third electrode in the direction perpendicular to the surface of the base substrate.

3. The display panel of claim 1, further comprising a connection electrode disposed on the first insulating layer,
wherein the connection electrode is electrically connected to the second electrode via a second contact hole penetrating through the insulating layer,
wherein the second contact hole overlap a metal pattern in the direction perpendicular to the surface of the first display substrate, and
wherein the metal pattern is disposed directly on a same layer as the third electrode.

4. The display panel of claim 1, wherein a dielectric constant of the first insulating layer is lower than a dielectric constant of the signal line.

5. The display panel of claim 1, wherein the first electrode and the second electrode are each made of a material that is different from a material of the signal line.

6. A display panel comprising:
a base substrate;
a semiconductor layer disposed on the base substrate;
a first electrode and a second electrode disposed on the semiconductor layer;
a first insulating layer disposed on both the first electrode and the second electrode;
a connection electrode disposed on the first insulating layer;
a second insulating layer disposed on the connection electrode; and a pixel electrode disposed on the second insulating layer,
wherein the connection electrode is electrically connected to the second electrode via a first contact hole penetrating through the first insulating layer,
wherein the pixel electrode is electrically connected to the connection electrode via a second contact hole penetrating though the second insulating layer,
wherein the connection electrode includes a portion which directly contacts the second electrode,
wherein the pixel electrode includes a portion which directly contacts the connection electrode,
wherein the portion of the connection electrode and the portion of the pixel electrode overlap each other in a direction perpendicular to the surface of the base substrate, and
wherein the first contact hole overlaps a metal pattern in the direction perpendicular to the surface of the base substrate, and wherein the metal pattern is disposed directly on a same layer as a third electrode.

7. The display panel of claim 6, wherein an upper surface of the first insulating layer is substantially planar.

8. The display panel of claim 6, wherein a dielectric constant of the first insulating layer is lower than a dielectric constant of the connection electrode.

9. The display panel of claim 6, wherein a thickness of a cross section of the first electrode is smaller than a thickness of a cross section of the connection electrode, and a thickness of a cross section of the second electrode is smaller than a thickness of a cross section of the connection electrode.

10. The display panel of claim 9, wherein the thickness of the cross section of the first electrode is less than or equal to half the thickness of the cross section of the connection electrode, and the thickness of the cross section of the second electrode is less than or equal to half the thickness of the cross section of the connection electrode.

11. The display panel of claim 6, wherein the first electrode and the second electrode each include a material that is not included in the connection electrode.

12. The display panel of claim 6, further comprising at least one reinforcing layer disposed on at least one surface of the base substrate,
wherein the at least one reinforcing layer includes silicon nitride (SiNx).

13. The display panel of claim 6, further comprising a signal line disposed on the first insulating layer,
wherein the signal line is directly connected to a portion of the first electrode, and
wherein the portion of the first electrode overlaps the third electrode in a direction perpendicular to the surface of the first display substrate.

14. A display panel comprising:
a first display substrate; and
a pixel electrode and a thin-film transistor disposed on a surface of the first display substrate,
wherein the thin-film transistor includes: a first electrode, a second electrode, a third electrode, and a semiconductor layer overlapping the third electrode,
wherein an insulating layer is disposed on both the first electrode and the second electrode,
wherein a signal line is directly connected to the first electrode,
wherein a thickness of the first electrode is less than a thickness of the signal line,
wherein an upper surface of the insulating layer is substantially planar,
wherein the first electrode includes a portion which directly contacts the semiconductor layer,
wherein the signal line includes a portion which directly contacts the first electrode,
wherein the portion of the first electrode which directly contacts the semiconductor layer overlaps an entirety of the portion of the signal line which directly contacts the first electrode in a direction perpendicular to the surface of the first display substrate, and
wherein the portion of the signal line and the portion of the first electrode overlap the third electrode in the direction perpendicular to the surface of the first display substrate.

15. The display panel of claim 14, wherein a connection electrode is connected to the second electrode and the thickness of the second electrode is less than half a smallest thickness of the connection electrode.

16. The display panel of claim 14:
wherein the signal line is electrically connected to the first electrode via a first contact hole penetrating through the insulating layer, and the connection electrode is electrically connected to the second electrode via a second contact hole penetrating through the insulating layer,
wherein the first contact hole overlaps the third electrode in the direction perpendicular to the surface of the first display substrate,
wherein the second contact hole overlaps a metal pattern in the direction perpendicular to the surface of the first display substrate, and
wherein the metal pattern is disposed directly on a same layer as the third electrode.

* * * * *